United States Patent [19]

Shigeta et al.

[11] 4,177,298

[45] Dec. 4, 1979

[54] METHOD FOR PRODUCING AN INSB THIN FILM ELEMENT

[75] Inventors: Junji Shigeta, Fuchu; Tetsu Oi, Tokyo; Nobuo Kotera, Kokubunji; Muneyasu Nakashima, Tokyo; Nobuo Miyamoto, Hachioji, all of Japan

[73] Assignee: Hitachi, Ltd., Japan

[21] Appl. No.: 888,465

[22] Filed: Mar. 20, 1978

[30] Foreign Application Priority Data

Mar. 22, 1977 [JP] Japan .................................. 52/30328
Mar. 25, 1977 [JP] Japan .................................. 52/32189

[51] Int. Cl.$^2$ .................. H01L 21/22; H01L 21/203; H01L 21/205
[52] U.S. Cl. ................................. 427/85; 148/186; 148/188; 156/605; 156/DIG. 70; 427/87; 427/124; 427/250; 427/376 R; 427/376 L
[58] Field of Search ............... 427/87, 85, 124, 250, 427/376 R, 376 E; 156/DIG. 70, 605; 148/188, 186

[56] References Cited

U.S. PATENT DOCUMENTS

| | | | |
|---|---|---|---|
| 2,938,816 | 5/1960 | Günther | 427/87 |
| 3,172,778 | 3/1965 | Günther et al. | 148/175 |
| 3,303,067 | 2/1967 | Haering et al. | 148/174 |
| 3,341,364 | 9/1967 | Collins | 427/87 |
| 3,554,818 | 1/1971 | Lambert et al. | 148/188 |
| 3,591,429 | 7/1971 | Clawson et al. | 148/1.5 |
| 3,600,237 | 8/1971 | Davis et al. | 427/87 |
| 3,898,359 | 8/1975 | Nadkarni | 427/87 |
| 4,080,721 | 3/1978 | Hung | 204/15 |
| 4,128,681 | 12/1978 | Kotera et al. | 427/87 |

OTHER PUBLICATIONS

Kotera et al., "Electrical Properties of InSb Thin Films in Low Noise Hall Generators on a Ferrite Substrate", Thin Solid Films, vol. 36, 483-485 (1976).

*Primary Examiner*—John D. Smith
*Attorney, Agent, or Firm*—Craig and Antonelli

[57] ABSTRACT

A method for producing an InSb thin film element comprising the steps of forming an InSb polycrystalline thin film on a substrate, melting and recrystallizing the InSb polycrystalline thin film at a temperature above the melting point of InSb, and disposing a diffusion source which contains at least one element selected from the group consisting of Cu, Au, Ag, Zn, Na, K, Cd, B, Li, Ca, Fe, Mg, Ba, Al and Pb and then heating the InSb thin film so as to dope it with the desired element or elements in a range in which the total quantity does not exceed a concentration of $1 \times 10^{18}$ cm$^{-3}$. The InSb thin film element produced by this method has a very little current noise and a high signal-to-noise ratio. Further more, simultaneous doping of the said predetermined element or said elements and sb is more effective to reduce the current noise.

24 Claims, 6 Drawing Figures

METHOD FOR PRODUCING AN INSB THIN FILM ELEMENT

BACKGROUND OF THE INVENTION

1. Field of the Invention

This invention relates to a method for producing an InSb thin film element which has very little current noise and which can make the signal-to-noise ratio great.

2. Description of the Prior Art

InSb (indium antimonide) which is one of compound semiconductors exhibits a remarkable galvano-magnetic effect. Therefore, it is often used for magneto-electric transducers such as Hall generator and magneto-resistive element. Since, at this time, InSb is required to be very thin, the physical evaporation process such as vacuum deposition or the chemical evaporation process such as well-known CVD (chemical vapor deposition) (hereunder, these processes shall be briefly termed "evaporation processes") is employed for the production of an InSb film. As the thickness of the InSb film, a value of roughly 3–0.1 $\mu$m is employed. A thickness below 0.1 $\mu$m is unsuitable for practical use because the level of noise itself is too high. The InSb thin film produced by the evaporation process is a polycrystalline film in which the crystal grain size is 1–20 $\mu$m in diameter and which includes many crystal defects. In order to coarsen crystal grains and to diminish the crystal defects, there has been adopted the zone-melting treatment of the InSb film. Even with this treatment, however, the grain size becomes 0.5–2 mm at the utmost, and the crystal defects cannot be completely removed. In case where an element is formed of such an InSb film and current is caused to flow therethrough, noise is superposed on the output thereof. The extent of the noise is as stated below by way of example. The example is of a case where a current of 4,000 A/cm$^2$ was caused to flow through a Hall generator having a film thickness of 2 $\mu$m and a generator width of 200 $\mu$m. When an evaporated InSb film was used, noise of 2–10 $\mu$V developed between Hall voltage terminals. When an InSb film subjected to the zone melting was used, noise of 0.6–2 $\mu$V appeared. These values are the root-mean-square values of noise voltages observed in a frequency band of 100 Hz–10 KHz. The Hall coefficients $R_H$ of such films were approximately 300–350 cm$^3$/C. When the signal magnetic field was 10 G, the above element provided an output of 2.5–2.8 mV. With the prior-art InSb film subjected to the zone melting, accordingly, the signal-to-noise ratio was 63–73 dB in the case of the above element. It was difficult to attain a higher signal-to-noise ratio.

In general, the behaviors of impurities in an InSb bulk single crystal have been investigated well. Regarding the InSb polycrystalline thin film, there have been reported an example in which the film is doped with Ge to the end of improving the temperature characteristic of the Hall coefficient, an example in which it is doped with S to the end of facilitating the zone melting, etc. In this connection, reference may be had to Japanese Unexamined Published Patent Application No. 49-135588 and U.S. Pat. No. 3,591,429 (1971) to A. R. Clawson et al. The behaviors of impurities in a polycrystal, however, have not been revealed. The inventors studied the effect of the impurity doping with notice taken of the signal-to-noise ratio of the InSb thin film element, and have led to this invention.

SUMMARY OF THE INVENTION

An object of this invention is to provide a method for producing an InSb thin film element whose current noise is very little and whose signal-to-noise ratio can be made high. In particular, the invention is greatly effective when applied to an InSb thin film which is approximately 0.1–3 $\mu$m thick.

In order to accomplish the object, this invention fundamentally comprises the steps of (i) forming an InSb thin film on a predetermined substrate by an evaporation process, (ii) melting and recrystallizing the InSb thin film at a temperature above the melting point thereof, and (iii) disposing a diffusion source containing at least one element selected from the group consisting of Cu, Au, Ag, Zn, Na, K, Cd, B, Li, Ca, Fe, Mg, Ba, Al and Pb and then heating the InSb thin film so as to dope it with the element or elements in a range in which the concentration of the total quantity is not higher than $1 \times 10^{18}$ cm$^{-3}$.

Further, the signal-to-noise ratio can be more enhanced by performing the diffusion of the predetermined element or elements under the condition under which Sb atoms exist in excess of the stoichiometric proportion.

Among the above-mentioned elements, Cu, Au and Ag are preferable in that the characteristics are more stable. Furthermore, simultaneous doping of Cu and Sb is much more effective to reduce the current noise.

While this invention can be voluntarily applied as a method for producing photoelectric transducers based on the PEM effect, it is advantageous especially in the production of thin-film magnetosensitive elements for low signals such as Hall generator and magneto-resistive element.

BRIEF DESCRIPTION OF THE DRAWINGS

FIG. 4 is a graph showing up to what extent the signal-to-noise ratios are enhanced under the optimum doping conditions when various elements are used as diffusion sources, while

DETAILED DESCRIPTION

Figure 1:
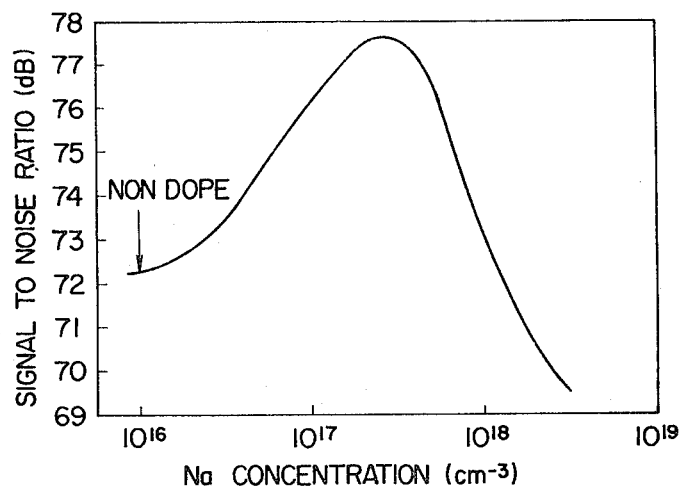
FIGS. 1 and 2 are graphs respectively showing the relationship between the Na concentration and the signal-to-noise ratio and the relationship between the Na concentration and the noise in the case where an InSb thin film was subjected to the zone melting and thereafter diffused with Na.

The inventors conducted various experiments in order to reduce the noise and enhance the signal-to-noise ratio of an InSb thin film being 0.1–3 $\mu$m thick. As the result, it has been found out very effective for the reduction of the noise and the enhancement of the signal-to-noise ratio that, after an InSb thin film formed by the evaporation process is once molten and recrystallized at a temperature above a melting point, the thermal diffusion of at least one member selected from the group consisting of Cu, Au, Ag, Zn, Na, K, Cd, B, Li, Ca, Mg, Pb, Ba, Al and Fe is performed.

As the evaporation process for forming the InSb thin film, the physical evaporation process such as vacuum deposition or the chemical evaporation process such as CVD (chemical vapor deposition) is employed as is well known.

For the recrystallization of the InSb thin film, it is the best to employ the well-known zone melting. Even when any other melting method, for example, homogeneous melting is employed, the effect of this invention can be achieved according to each method.

Impurities effective for the enhancement of the signal-to-noise ratio are Cu, Au, Ag, Zn, Na, K, Li, Cd, B, Fe, Ca, Mg, Ba, Al and Pb. Except Pb and Fe, these elements are restricted to groups I, II and III of the periodic table. The reason why the elements are effective to enhance the signal-to-noise ratio is unknown. It is thought, however, that they will couple with defects included in the InSb film and reduce the noise generating capability of the defects.

The Hall coefficient of the InSb thin film shows a tendency to increase irrespective of the sorts of the elements. This fact implies that, unlike the known behaviors of impurities in single-crystal bulk InSb, impurities in the polycrystalline InSb film are closely related to the crystal defects. Regarding the quantities of impurities which render the signal-to-noise ratio the best, all the elements exhibit similar tendencies, and they fall within a range not exceeding $1 \times 10^{18}$ cm$^{-3}$. In case of mixing two or more of the elements, the total quantity should preferably fall within the aforecited range.

Although the thermal diffusion of the predetermined impurity or impurities demonstrates the corresponding effect, the optimum concentration of the impurity or impurities ranges from $5 \times 10^{16}$ cm$^{-3}$ to $1 \times 10^{18}$ cm$^{-3}$.

Now, a method for diffusing the impurity or impurities into the InSb thin film by heating will be explained.

A typical method is an expedient wherein as a diffusion source, a substance which contains at least one of the predetermined elements as mentioned previously (of course, which covers the simple substance of the element) is held in contact with the surface of the InSb polycrystalline thin film subjected to the zone melting, and the InSb thin film is heated at a temperature below the melting poitn of InSb. Here, the substance containing the predetermined element may be any substance that can decompse and liberate the element and diffuse it into the InSb film during the heating of InSb. Suitable for this purpose are the simple substances of the respective elements, and besides, hydroxides, oxides and carbonates thereof, thermosetting glasses doped with the elements, etc.

There will be listed the substances which are suited to the diffusion sources for thermally diffusing the respective elements. Cu, Au, Ag, Zn, Cd, Al, Pb, etc. are easy to be used as the element simple substances; NaOH, Cu(OH)$_2$, Zn(OH)$_2$, KOH, LiOH, Ca(OH)$_2$, Mg(OH)$_2$, Ba(OH)$_2$, Al(OH)$_3$, Fe(OH)$_3$, etc. as the hydroxides; and CuO, ZnO, CaO, MgO, BaO, PbO, etc. as the oxides. Further, the carbonates including Na$_2$CO$_3$, ZnCO$_3$, K$_2$CO$_3$, MgCO$_3$, etc. can be used.

As means for bringing the diffusion source into contact with the InSb thin film, various ones are considered, and examples are as described hereunder. In case of bringing into contact the hydroxide such as Cu(OH)$_2$, NaOH, KOH, LiOH, Ca(OH)$_2$, Mg(OH)$_2$, Ba(OH)$_2$, Al(OH)$_3$, Zn(OH)$_2$ and Fe(OH)$_3$, it is the easiest to prepare an aqueous solution thereof or disperse it into an organic solvent such as alcohol and ether and to immerse the InSb thin film into the solution or dispersoid.

In case where the area of the InSb thin film element is large, the impurity can be uniformly applied by the use of a spinner. The impurity layer may be applied to such an extent of thickness that it can be visually observed as a membrane. When the thickness of the InSb thin film is approximately 0.1–3 μm, the thickness of the impurity layer is not very influential.

In case of using the element simple substance, it may be deposited directly onto the surface of InSb to the extent of several tens—several hundreds Å by the vacuum deposition. In practical use, a thickness of 50 Å to 300 Å is often employed. Of course, when the element used is conductive, the evaporated layer must not be too thick. Besides the evaporation process, the well-known ion implantation can be relied on.

It is also possible to separately dope the thermosetting glass with the desired element in advance and to employ it as the diffusion source. For example, "Spin-on-glass" (thermosetting glass produced by Emulsitone Inc.) containing B is preferable as the diffusion source of B.

The diffusion sources can be disposed by the methods different depending on the sorts of the elements as stated above. It has been judged, however, that no significant difference in characteristics is brought forth by the ways of disposing the diffusion sources.

The InSb thin film provided with the diffusion source of the impurity is heat-treated or annealed in a vacuum oven (under approximately $10^{-1}$ Torr) at a temperature below the melting point of InSb. During the annealing, the impurity diffuses into the InSb thin film. As to any of the elements, the heating is remarkably effective when carried out at 250°–450° C. for 1 minute or longer, and it is the most effective when carried out at 300°–400° C. for 1 minute or longer. Although the heating period of time needs to be at least 1 minute, it is often 20 minutes to 2 hour in practical use. Even when the InSb thin film is heated for a very long time, the effect of improving the signal-to-noise ratio presents a tendency of saturation.

A second method is an expedient wherein a layer of at least one of the predetermined impurity elements as stated before is formed on a desired substrate in advance, the InSb thin film is formed on the layer by the evaporation process, and the zone-melting treatment is executed. This is an example in which the layer of the diffusion source is disposed on the rear surface of the InSb polycrystalline thin film.

In this case, a thermosetting glass layer doped with the desired impurity element or elements may be employed as the impurity layer. A substrate material doped with the desired impurity element or elements may also be used for the diffusion source.

A third method is an expedient wherein the InSb thin film is formed on a desired substrate by the evaporation process, a substance containing the element or elements is held in contact with the front surface of the InSb thin film, and thereafter, the zone-melting treatment is executed. At this time, as means for diffusing the predetermined element or elements, there is one in which a substance containing the predetermined element or elements is held in contact as described in connection with the first method. In this case, a thermosetting glass layer doped with the impurity element or elements may be employed as an impurity layer. Alternatively, the predetermined element or elements may be contained in a protective film (usually, $In_2O_3$ film) for preventing the molten InSb from rounding due to a surface tension.

Further, the inventors have found out that the signal-to-noise ratio is more improved when InSb is heated under the condition under which, in thermally diffusing at least one of Cu, Au, Ag, Zn, Na, K, Cd, B, Li, Ca, Mg, Ba, Al, Pb and Fe, the atoms of Sb exist in excess of the stoichiometric proportion. Here, the condition of excess Sb signifies the condition under which a substance containing Sb such as $Sb_2O_5$ (the diffusion source of Sb) is held in contact with the InSb film. As compounds to serve the diffusion source of Sb, there are, for example, $Sb_2O_5$, $Sb_2O_5.H_2O$, $Sb_2O_5.2H_2O$, $Sb_2O_5.3H_2O$, $Sb(OH)_3$ and $Sb(OH)_5.xH_2O$.

In this case, Sb is remarkable especially in the effect of reducing noise, and the other elements are remarkable especially in the effect of enlarging the Hall coefficient and enlarging the signal. The doping quantity of the impurity element or elements lies in the range not exceeding $1 \times 10^{18}$ cm$^{-3}$ as described before.

The way of disposing the diffusion source of Sb may be the same as in the foregoing case of the impurity element or elements. In the case where the Sb diffusion source coexists with the foregoing impurity diffusion source, the heating conditions do not greatly vary. With a heat treatment in a temperature range of 250°–450° C. for 1 minute or longer, at least an effect equivalent to that in the foregoing is ensured. In particular, with a heat treatment at approximately 300°–400° C. for 20 minutes—2 hour or so, the enhancement of the signal-to-noise ratio is the most remarkable.

Hereunder this invention will be concretely described in conjunction with examples, from which the features and advantages of the invention will become more apparent.

EXAMPLE 1

InSb was deposited on a glass substrate (trade name #7059, Corning Inc.) washed well to a film thickness of 2 μm by the three-temperature evaporation method, a protective film of $In_2O_3$ was formed on the surface, and the zone-melting treatment was carried out. Thereafter, the $In_2O_3$ was removed by polishing with soft cloth, and the InSb surface was finished to be flat. At this time, the thickness of the InSb thin film was varied into 0.5 μm, 1.4 μm and 3 μm. Thereafter, the surface of the InSb thin film was etched with a diluted solution of KOH or aqua regia, to eliminate the contamination of the surface. A desired impurity element was held in contact with the surface of the InSb thin film. More specifically, the InSb film was immersed in an alcohol or ether solution of a hydroxide such as $Cu(OH)_2$, NaOH, KOH, LiOH, $Ca(OH)_2$, $Mg(OH)_2$, $Ba(OH)_2$, $Al(OH)_3$, $Zn(OH)_2$ and $Fe(OH)_3$, and then dried. Regarding Au, Ag, Cd and Pb, the element was deposited directly on the InSb surface 100 Å by the evaporation process. Regarding B, thermosetting glass containing the impurity as commercially available under the trade name "Spin-on-glass" (Emulsitone Inc.) was applied. The InSb thin film with the impurity brought into contact therewith in such a way was heated at a temperature below the melting point of InSb in a vacuum over under $10^{-1}$ Torr. Although, in this example, the InSb was subjected to the diffusion treatment in the atmosphere under $10^{-1}$ Torr, it may be treated in an inert gas. Besides, when the surface of the InSb film is covered with a proper protective film (for example, glass film) in advance, the diffusion treatment may be executed in the atmospheric air.

Thereafter, a Hall generator being 200 μm wide was formed by the photolithographic process. A current of 4,000 A/cm$^2$ and a magnetic field of 10 G were impressed on the Hall generator, and an output S and noise N (in a frequency band of 100 Hz–10 KHz) appearing across Hall terminals were assessed.

Figure 2:
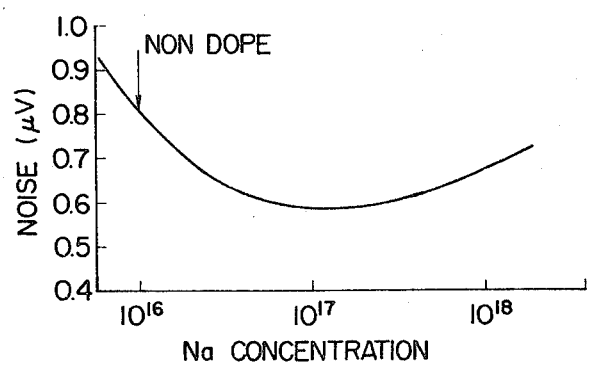

FIGS. 1 and 2 show examples in which the variations of the signal-to-noise ratio and the noise level at the time when the InSb film 1.4 μm thick was subjected to the zone melting and subsequently doped with Na were assessed with the Hall element, respectively. It is understood that, when the Na concentration exceeds $1 \times 10^{18}$ cm$^{-3}$, the signal-to-noise ratio is rather degraded. The signal-to-noise ratio of the polycrystalline InSb film containing Na at a concentration of $5 \times 10^{16} - 1 \times 10^{18}$ is 73–79 dB, which is more excellent than that of the zone-molten film without the doping. More preferably, the Na concentration is $1 \times 10^{17} - 6 \times 10^{17}$ cm$^{-3}$ or so.

The impurity concentration was calculated from the general relation between the electron mobility and the impurity concentration on the basis of electric characteristics. The general relation between the electron mobility and the impurity concentration is described in, for example, "Semiconducting III–V compound," page 128 (1961) by Hilsum.

Figure 3:
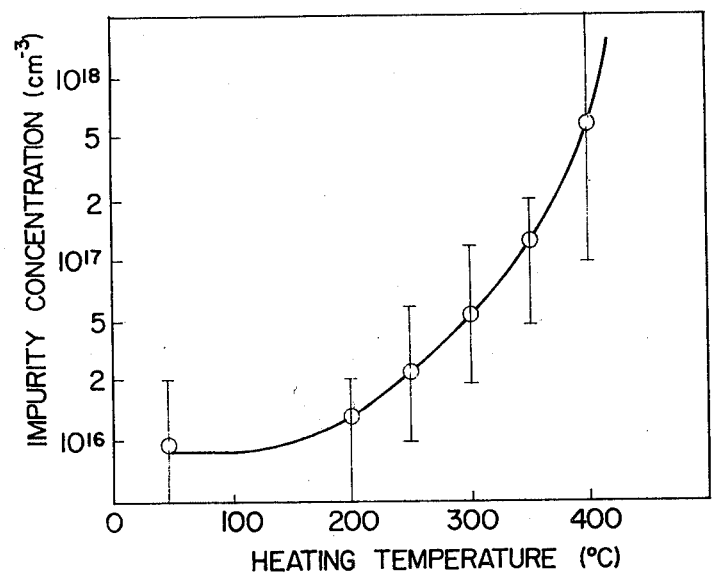
FIG. 3 shows the variation of the impurity concentration in the case where an InSb thin film was heated in contact with a diffusion source.

FIG. 3 illustrates examples of the doping quantities of various impurities in the case where the InSb thin films were heated in contact with the diffusion sources of the impurities. The heating time was 30 minutes. Regarding the relationship between the heating condition and the doping quantity of the impurity, there are, of course, minute differences among the various diffusion sources, but the differences may be substantially ignored from the viewpoint of the actual control in industry.

Table 1 indicates the signal-to-noise ratios of InSb films as obtained by doping the films with the various elements under the optimum conditions.

TABLE 1

| Elements | Signal-to-noise ratio | Elements | Signal-to-noise ratio |
|---|---|---|---|
| Na | 72–79 dB | B | 73–79 dB |
| Cu | 74–79 | Ca | 72–78 |
| Au | 72–79 | Mg | 72–78 |
| Ag | 72–79 | Ba | 72–78 |
| Zn | 70–78 | Al | 72–78 |
| K | 72–78 | Fe | 72–78 |
| Li | 71–77 | Pb | 72–78 |
| Cd | 71–78 | | |

According to the experimental results, the signal-to-noise ratios obtained disperse to some extent. This is partly attributed to the dispersion of the characteristics themselves of the InSb thin films formed at first. However, it holds true that the signal-to-noise ratio is enhanced by doping the InSb thin film with the predetermined element.

Figure 4:
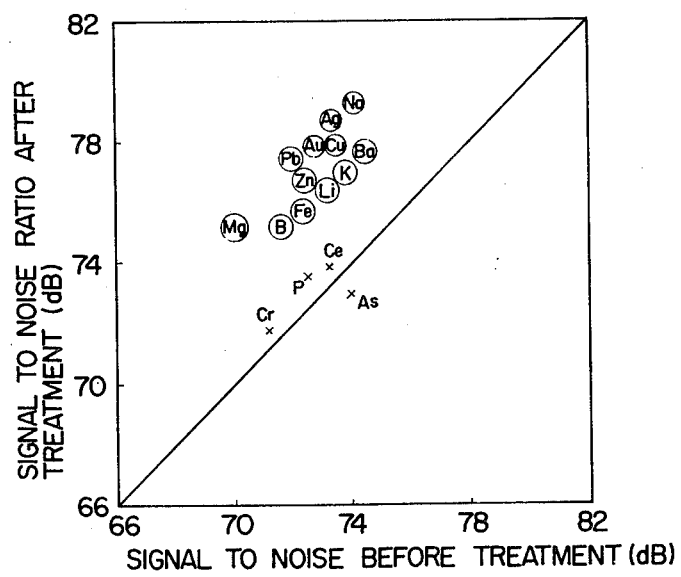

FIG. 4 illustrates to what extent the signal-to-noise ratios are enhanced at the utmost under the optimum doping conditions when various elements are used as the diffusion sources. The abscissa represents the signal-to-noise ratio before the annealing or heat treatment of this invention, while the ordinate represents the signal-to-noise ratio after the heat treatment. With Cr, P, Ce and As which are other than the elements for use in this invention, the effect of enhancing the signal-to-noise ratio is hardly noted.

Figure 5:
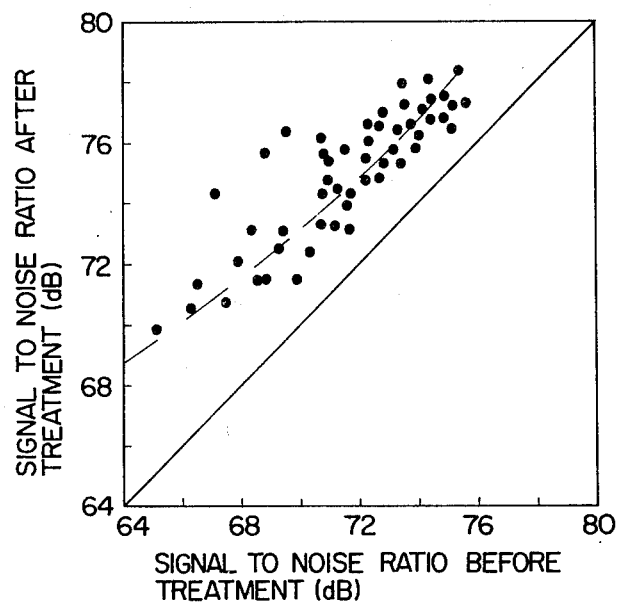
FIG. 5 is a graph showing to what extent the signal-to-noise ratio is enhanced in the case where Cu is used as a diffusion source.

FIG. 5 shows experimental results of the extent to which the signal-to-noise ratio is enhanced in case of using Cu for the diffusion source. The abscissa represents the signal-to-noise ratio before the heat treatment, while the ordinate represents the signal-to-noise ratio after the heat treatment. It has been revealed from the data that the effect of this invention is achieved irrespective of the characteristics of the InSb thin films before the heat treatment.

The signal-to-noise ratios are results are measured under conditions of a current density of 4,000 A/cm$^2$, an applied magnetic field of 10 G and a frequency band of 100 Hz–10 KHz.

Among the various predetermined elements, Cu, Au and Ag have more stable characteristics and are particularly excellent diffusion substances.

EXAMPLE 2

In the present example, an InSb thin film is doped with Sb and an impurity element simultaneously at a temperature below the melting point of InSb.

On a substrate in which #7059 glass film (Corning Inc.) was formed by sputtering on an Ni-Zn type ferrite whose surface was finished into a mirror surface, InSb was deposited by the three-temperature evaporation method. After forming an $In_2O_3$ protective film on the surface, the zone-melting treatment was carried out in accordance with the well-known method. Thereafter, the $In_2O_3$ was removed by the polishing with soft cloth, and the surface of the InSb film was finished to be flat. At this time, the thickness of the InSb film was made 1.5 μm. The surface of such an InSb film was chemically etched with a diluted solution of KOH or aqua regia, to eliminate contaminative substances adherent to the surface.

Sb and the diffusion source of the predetermined impurity element were deposited on the surface of the InSb thin film thus formed. Various methods for realizing the deposition are considered. As to Sb, a method of applying $Sb_2O_5$ was employed. The impurity elements were handled as stated below. Regarding Cu, Na, K, Li, Ca, Mg, Ba, Al, Zn and Fe, a method of depositing compounds to serve the diffusion sources was employed. As the compounds, there were respectively used $Cu(OH)_2$, NaOH, KOH, LiOH, $Ca(OH)_2$, $Mg(OH)_2$, $Ba(OH)_2$, $Al(OH)_3$, $Zn(OH)_2$ and $Fe(OH)_3$. The InSb film was immersed in an aqueous solution or alcohol solution of the Sb compound and such a compound of the impurity, and then dried. Regarding Au, Ag, Cd and Pb, each impurity was deposited 100 Å directly on the surface of the InSb film by the evaporation process, and the Sb compound was thereafter deposited. Regarding B, theremosetting glass being commercially available under the trade name of "Spin-on-glass" (Emulsitone Inc.) and containing the element atoms of Sb and B was applied.

The InSb films on which Sb and the diffusion sources of the impurity elements were deposited by the methods as stated above were heated in a vacuum oven under $10^{-1}$ Torr. Using each InSb film thus diffused with Sb and the impurity element, a Hall generator 200 μm wide with formed by the photolithographic process. The Hall output and noise of the Hall generator were assessed under the same conditions as in Example 1. As the result, in any of the combinations between the atoms of Sb and the atoms of the predetermined elements, especially the annealing at 300°–400° C. for approximately 1 hour was the most remarkable in the enhancement of the signal-to-noise ratio. Table 2 indicates the signal-to-noise ratios of the Hall generators produced by the above method.

TABLE 2

| Elements | Signal-to-noise ratio | Elements | Signal-to-noise ratio |
|---|---|---|---|
| Cu | 75–82 dB | B | 75–82 dB |
| Au | 74–82 | Li | 73–81 |
| Ag | 74–82 | Ca | 74–81 |
| Zn | 73–81 | Mg | 74–81 |
| Na | 74–82 | Ba | 74–81 |
| K | 74–81 | Al | 74–81 |
| Cd | 73–81 | Fe | 74–80 |
|  |  | Pb | 74–80 |

As apparent from Table 2, the InSb films doped with the Sb atoms and the impurity atoms achieved the signal-to-noise ratios still greater than the maximum values of the signal-to-noise ratios attained in the case of diffusing the impurities without the supply of Sb, i.e., 70–79 dB.

Figure 6:
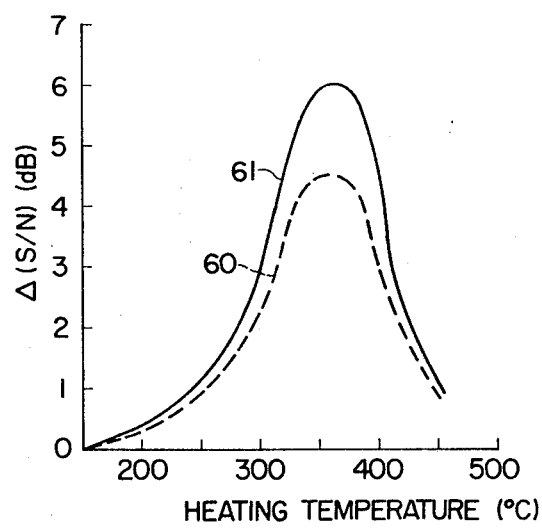
FIG. 6 is a graph showing the relationship between the heating temperature and the proportion of the enhancement of the signal-to-noise ratio.

FIG. 6 illustrates an example of the relationship between the heating temperature and the rate of the enhancement of the signal-to-noise ratio. Curve 60 corresponds to a case where the InSb film was doped with only Cu, while curve 61 corresponds to a case where it was doped with Cu and Sb simultaneously. The diffusion source was $Cu(OH)_2$ for Cu, and $Sb_2O_5$ for Sb. At each temperature, the heat treatment was conducted for 30 minutes. It is apprehended from this example that the signal-to-noise ratio can be more enhanced in the case of doping the InSb film with both Cu and Sb. It is also apprehended that a range of 250°–450° C. ought to be employed for the heating temperature and that a range of 300°–400° C. is an extraordinarily favorable condition.

Even when two or more elements selected from the group consisting of the predetermined elements are used, quite similar effects can be achieved. By way of example, when diffusion sources as listed in Table 3 were employed, enhancements of the signal-to-noise ratios amounting to 3–6 dB were similarly noted.

TABLE 3

| Dopant elements | Diffusion sources |
|---|---|
| Au—Cu | metal Au, $Cu(OH)_2$ |
| Au—Cu—Sb | metal Au, $Cu(OH)_2$, $Sb_2O_5$ |
| Na—Cu | NaOH, $Cu(OH)_2$ |
| Na—Cu—Sb | NaOH, $Cu(OH)_2$, $Sb_2O_5$ |

As the method for supplying the Sb atoms, besides the method of the external supply described in the present example, there is one wherein a film in which Sb is in excess of the stoichiometric proportion (preferably, Sb is contained to the extent that it does not precipitate at the melting) is previously formed as the InSb evaporated film. When such films were used as InSb thin films into which the impurity atom elements other than Sb were to be diffused, like results could be attained.

Thus far, description has been made of the method for producing the InSb thin film element exhibiting low noise and having a high signal-to-noise ratio.

Although the extent of the improvement of the characteristics is inferior to that in the InSb thin film element formed by the foregoing method of production, the effects of the improvement of the characteristics of the same sort can also be achieved by the following methods of production:

1. A diffusion source which contains at least one member selected from the group consisting of Cu, Au, Ag, Zn, Na, K, Cd, B, Li, Ca, Mg, Pb, Ba, Al and Fe is brought into contact with an InSb polycrystalline thin film on a predetermined substrate, and the zone melting is subsequently carried out.

2. An Sb diffusion source, and a diffusion source which contains at least one member selected from the group consisting of Cu, Au, Ag, Zn, Na, K, Cd, B, Li, Ca, Mg, Pb, Ba, Al and Fe are brought into contact with an InSb polycrystalline thin film on a predetermined substrate, and the zone melting is subsequently executed.

For either of these methods, the same impurity diffusion sources and Sb diffusion source as in the foregoing can be employed.

The concentrations of the impurities to be included into the InSb thin films by these methods must not exceed $1 \times 10^{18}$ cm$^{-3}$ as described previously.

By way of example, InSb thin film elements were produced by procedures to be stated below.

On a substrate in which #7059 glass film (Corning Inc.) was deposited on a ferrite plate, InSb of stoicheometric composition was deposited 2 $\mu$m by the three-temperature method. Thereafter, Sb being one of the elements to be diffused was further evaporated 0.1 $\mu$m so as to form a double film of InSb and Sb. Subsequently, in case where the other impurity element was Na or K, the resultant structure was immersed in a 10-% alcohol solution of NaOH or KOH and then dried. Thereafter, a protective film of In$_2$O$_3$ was formed, and the zone melting was conducted. When the signal-to-noise ratio of the InSb film thus obtained was assessed by the same method as in Example 2, predetermined characteristics could be attained.

The InSb thin film prepared as described above was immersed in a 10-% alcohol solution of LiOH, and then dried. Thereafter, a protective film of In$_2$O$_3$ was formed, and the zone melting was conducted. When the signal-to-noise ratio of the InSb thin film thus obtained was assessed by the same method as in Example 1, it was approximately 70-75 dB. Accordingly, the effect of enhancing the signal-to-noise ratio is also demonstrated.

The above method makes it possible to prepare large quantities of diffusion sources as compared with the case of the diffusion in the solid phase, and to control the impurity concentrations by repeating the zone melting.

What is claimed is:

1. A method for producing an InSb thin film element, comprising the step of forming by an evaporation method an InSb polycrystalline thin film having a thickness of 0.1 $\mu$m-3 $\mu$m on a predetermined substrate, the step of subjecting said thin film to zone melting to melt and recrystallize the InSb polycrystalline thin film at a temperature above the melting point of InSb, and then the step of holding a diffusion source in contact with said thin film, said diffusion source comprising at least one substance containing at least one element selected from the group consisting of Cu, Au, Ag, Zn, Na, K, Cd, B, Li, Ca, Fe, Mg, Ba, Al and Pb, and heating said thin film at a temperature below the melting point of InSb so as to dope the thin film with said at least one element to have a dopant concentration of not greater than $1 \times 10^{18}$ cm$^{-3}$, whereby a thin film element having a high signal-to-noise ratio is formed.

2. A method for producing an InSb thin film element as defined in claim 1, wherein said thin film is heated at a temperature of 250°-450° C. for at least 1 minute.

3. A method for producing an InSb thin film element as defined in claim 2, wherein said at least one substance contains at least one element selected from the group consisting of Cu, Na, K, Li, Ca, Fe, Mg, Ba and Al, and is a hydroxide of these elements.

4. A method for producing an InSb thin film element as defined in claim 2, wherein said at least one substance contains at least one element selected from the group consisting of Cu, Zn, Ca, Mg, Ba and Pb, and is an oxide of these elements.

5. A method for producing an InSb thin film element as defined in claim 2, wherein said at least one substance contains at least one element selected from the group consisting of Na, Zn, K and Mg, and is a carbonate of these elements.

6. A method for producing an InSb thin film element as defined in claim 2, wherein said at least one substance contains at least one element selected from the group consisting of Cu, Au, Ag, Zn, Cd, Fe, Mg, Al and Pb, and is in the elemental form.

7. A method for producing an InSb thin film element as defined in claim 2, wherein the diffusion source is held in contact with said thin film by forming a thin layer of at least one element selected from the group consisting of Cu, Au, Ag, Zn, Cd, Fe, Mg, Al and Pb, on said thin film to a thickness at which the thin layer does not become conductive.

8. A method for producing an InSb thin film element as defined in claim 1, wherein said thin layer of at least one element selected from the group consisting of Cu, Au, Ag, Zn, Cd, Fe, Mg, Al and Pb is formed to a thickness of 50-300 Å.

9. A method for producing an InSb thin film element as defined in claim 1, wherein the heating is carried out at a temperature of 300°-400° C. for at least 1 minute.

10. A method for producing an InSb thin film element as defined in claim 6, wherein the step of holding a diffusion source in contact with said thin film and heating said thin film comprises forming on said thin film a thin layer of hydroxides of at least one element selected from the group consisting of Cu, Na, K, Li, Ca, Fe, Mg, Ba and Al, and heating said thin film at a temperature of 300°-400° C. for at least 1 minute.

11. A method for producing an InSb thin film element as defined in claim 1, wherein the step of holding a diffusion source in contact with said thin film and heating said thin film comprises forming a thin layer of at least one element selected from the group consisting of Cu, Au, Ag, Zn, Cd, Fe, Mg, Al and Pb, on said thin film to a thickness of 50-300 Å, and heating said thin film at a temperature of 300°-400° C. for at least 1 minute.

12. A method for producing an InSb thin film element as defined in claim 1, wherein the step of holding a diffusion source in contact with said thin film and heating said thin film comprises forming on said thin film a thermosetting glass layer doped with at least one element selected from the group consisting of Cu, Au, Ag, Zn, Na, K, Cd, B, Li, Ca, Fe, Mg, Ba, Al and Pb, and heating said thin film at a temperature of 300°-400° C. for at least 1 minute.

13. A method for producing an InSb thin film element as defined in claim 1, wherein the concentration of the total quantity of the at least one element with which said InSb thin film is doped is $5 \times 10^{16}$ cm$^{-3}$–$1 \times 10^{18}$ cm$^{-3}$.

14. A method for producing an InSb thin film element as defined in claim 1, wherein said diffusion source comprises at least one substance containing at least one element selected from the group consisting of Cu, Au and Ag.

15. A method for producing an InSb thin film element, comprising the step of forming by an evaporation method an InSb polycrystalline thin film having a thickness of 0.1 μm–3 μm on a predetermined substrate, the step of subjecting said InSb polycrystalline thin film to zone melting to melt and recrystallize said InSb polycrystalline thin film at a temperature above the melting point of InSb, and then the step of holding a diffusion source of Sb and another diffusion source in contact with said thin film, said another diffusion source comprising at least one substance containing at least one element selected from the group consisting of Cu, Au, Ag, Zn, Na, K, Cd, B, Li, Ca, Mg, Pb, Ba, Al and Fe, and heating said thin film at a temperature below the melting point of InSb so as to provide an excess of Sb atoms in the thin film and to dope the thin film with said at least one element to have a dopant concentration of not greater than $1 \times 10^{18}$ cm$^{-3}$, whereby a thin film element having a high signal-to-noise ratio is formed.

16. A method for producing an InSb thin film element as defined in claim 15, wherein the heating is carried out at a temperature of 250° C.–450° C. for at least 1 minute.

17. A method for producing an InSb thin film element as defined in claim 15, wherein the heating is carried out at a temperature of 300° C.–400° C. for at least 1 minute.

18. A method for producing an InSb thin film element as defined in claim 15, wherein as said diffusion source of Sb, at least one member selected from the group consisting of elemental Sb, an oxide of Sb, a hydroxide of Sb and a thermosetting glass containing Sb is employed.

19. A method for producing an InSb thin film element as defined in claim 15, wherein said at least one substance contains at least one element selected from the group consisting of Cu, Na, K, Li, Ca, Fe, Mg, Ba and Al, and is a hydroxide of these elements.

20. A method for producing an InSb thin film element as defined in claim 15, wherein said at least one substance contains at least one element selected from the group consisting of Cu, Zn, Ca, Mg, Ba and Pb, and is an oxide of these elements.

21. A method for producing an InSb thin film element as defined in claim 15, wherein said at least one substance contains at least one element selected from the group consisting of Na, Zn, K and Mg, and is a carbonate of these elements.

22. A method for producing an InSb thin film element as defined in claim 15, wherein said at least one substance contains at least one element selected from the group consisting of Cu, Au, Ag, Zn, Cd, Fe, Mg, Al and Pb, and is in the elemental form.

23. A method for producing an InSb thin film element as defined in claim 15, wherein the concentration of the total quantity of the at least one element with which said InSb thin film is doped is $5 \times 10^{16}$ cm$^{-3}$–$1 \times 10^{18}$ cm$^{-3}$.

24. A method for producing an InSb thin film element as defined in claim 15, wherein said another diffusion source comprises at least one substance containing at least one element selected from the group consisting of Cu, Au and Ag.

* * * * *